(12) United States Patent
Shih et al.

(10) Patent No.: US 8,330,280 B1
(45) Date of Patent: Dec. 11, 2012

(54) BUMP STRUCTURE AND PROCESS OF MANUFACTURING THE SAME

(75) Inventors: Cheng-Hung Shih, Zhudong Township, Hsinchu County (TW); Shyh-Jen Guo, Hsinchu (TW); Wen-Tung Chen, Qionglin Township, Hsinchu County (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/163,967

(22) Filed: Jun. 20, 2011

(51) Int. Cl.
*H01L 29/40* (2006.01)

(52) U.S. Cl. ........ 257/781; 438/613; 438/614; 257/737; 257/280; 257/286

(58) Field of Classification Search .......... 257/777–781, 257/668, 773, 737, 738, 678; 438/612, 613, 438/123
See application file for complete search history.

(56) References Cited

U.S. PATENT DOCUMENTS

| | | | | |
|---|---|---|---|---|
| 5,631,499 A | * | 5/1997 | Hosomi et al. | 257/737 |
| 6,417,089 B1 | * | 7/2002 | Kim et al. | 438/612 |
| 6,441,500 B1 | * | 8/2002 | Sumikawa et al. | 257/780 |
| 6,566,752 B2 | * | 5/2003 | Hsia et al. | 257/734 |
| 6,577,001 B2 | * | 6/2003 | Kobayashi | 257/737 |
| 2002/0180064 A1 | * | 12/2002 | Hwan et al. | 257/780 |

* cited by examiner

*Primary Examiner* — Asok K Sarkar
*Assistant Examiner* — Dmitriy Yemelyanov
(74) *Attorney, Agent, or Firm* — Jackson IPG PLLC

(57) ABSTRACT

A bump structure comprises a first polymer block, a second polymer block, a first groove, an under bump metallurgy layer and a connection metal layer, wherein the first polymer block and the second polymer block are individual blocks. The first polymer block and the second polymer block are located at two sides of the first groove, the first polymer block comprises a first connection slot, and the second polymer block comprises a second connection slot communicated with the first connection slot and the first groove. The under bump metallurgy layer covers the first polymer block and the second polymer block to form a second groove, a third connection slot and a fourth connection slot communicated with each other. The connection metal layer covers the under bump metallurgy layer to form a third groove, a fifth connection slot and a sixth connection slot communicated with each other.

8 Claims, 16 Drawing Sheets

BUMP STRUCTURE AND PROCESS OF MANUFACTURING THE SAME

FIELD OF THE INVENTION

The present invention is generally relating to a bump structure and process of manufacturing the same, more particularly to a bump structure and process of manufacturing the same that improves coupling strength.

BACKGROUND OF THE INVENTION

With reference to FIG. 1, a conventional gold bump structure 10 is formed on a silicone substrate 20, mentioned silicone substrate 20 comprises a plurality of bond pads 21 and a protecting layer 22, wherein a plurality of openings 23 are formed on the protecting layer 22, and the openings 23 reveal the bond pads 21. The gold bump structure 10 comprises an under bump metallurgy layer 11 and a gold bump layer 12, the under bump metallurgy layer 11 is formed on the bond pads 21, and the gold bump layer 12 is formed on the under bump metallurgy layer 11. When the gold bump structure 10 is eutecticly bonded with one contact (such as connection pad or pin) of the other electronic device, the contact area between the gold bump structure 10 and the contact is insufficient to degrade coupling strength between the gold bump structure 10 and the contact. In addition, a displacement phenomenon occurred in the process of coupling the contact and the gold bump structure 10 may cause a short condition between adjacent contacts. Besides, the gold bump structure 10 is composed of the gold bump layer 12 and leads a higher production cost.

SUMMARY

The primary object of the present invention is to provide a bump structure disposed on a substrate, the substrate comprises a plurality of bond pads and a protecting layer, wherein the protecting layer comprises a plurality of openings, and the openings reveal the bond pads. The bump structure is electrically connected with each of the bond pads and comprises a first polymer block, a second polymer block, a first groove, an under bump metallurgy layer and a connection metal layer, wherein the first polymer block and the second polymer block are individual blocks, located at two sides of the first groove and disposed on the bond pad and the protecting layer. The first groove reveals the bond pad. The first polymer block comprises a first top surface and a first connection slot recessed from the first top surface, the second polymer block comprises a second top surface and a second connection slot recessed from the second top surface, wherein the first connection slot of the first polymer block and the second connection slot of the second polymer block are in communication with the first groove. The under bump metallurgy layer covers the first polymer block, the second polymer block and the bond pad to form a second groove, a third connection slot and a fourth connection slot, wherein the third connection slot and the fourth connection slot are in communication with the second groove. The connection metal layer covers the under bump metallurgy layer to form a third groove, a fifth connection slot and a sixth connection slot, wherein the fifth connection slot and the sixth connection slot are in communication with the third groove. The second groove of the under bump metallurgy layer is located between the first groove and the third groove of the connection metal layer, the third connection slot of the under bump metallurgy layer is located between the first connection slot of the first polymer block and the fifth connection slot of the connection metal layer, and the fourth connection slot of the under bump metallurgy layer is located between the second connection slot of the second polymer block and the sixth connection slot of the connection metal layer.

Another object of the present invention is to provide a process of manufacturing a bump structure comprising the steps described as follow: first, providing a substrate having a plurality of bond pads and a protecting layer, the protecting layer comprises a plurality of openings, and the openings reveal the bond pads; next, forming a polymer layer on the substrate, the polymer layer covers the protecting layer and the bond pads; then, providing a first mask and performing a first exposure; thereafter, removing the first mask and performing a first development to enable the polymer layer to form a plurality of polymer bumps, each of the polymer bumps corresponds one bond pad and comprises a first polymer block, a second polymer block and a first groove, wherein the first polymer block and the second polymer block are individual blocks and located at two sides of the first groove respectively, the first groove reveals the bond pad, the first polymer block and the second polymer block are disposed on the bond pad and the protecting layer, wherein the first polymer block comprises a first top surface and a first connection slot recessed from the first top surface, and the second polymer block comprises a second top surface and a second connection slot recessed from the second top surface, the first connection slot of the first polymer block and the second connection slot of the second polymer block are in communication with the first groove; afterward, curing the polymer bumps; later, forming an under bump metallurgy layer on the substrate, the under bump metallurgy layer covers the protecting layer, the bond pad, the first polymer block and the second polymer block, wherein a second groove, a third connection slot and a fourth connection slot are formed on the under bump metallurgy layer, the second groove is in communication with the third connection slot and the fourth connection slot and located on top of the first groove, the third connection slot is located on top of the first connection slot, and the fourth connection slot is located on top of the second connection slot; next, forming a photoresist layer on the under bump metallurgy layer; thereafter, providing a second mask and performing a second exposure; then, removing the second mask and performing a second development to enable the photoresist layer to form a plurality of openings, each of the openings corresponds each of the polymer bumps and reveals the under bump metallurgy layer located within each of the openings; afterward, forming a connection metal layer within the openings, the connection metal layer covers the under bump metallurgy layer revealed by the openings, wherein a third groove, a fifth connection slot, and a sixth connection slot are formed on the connection metal layer, the third groove is in communication with the fifth connection slot and the sixth connection slot and located on top of the second groove, the fifth connection slot is located on top of the third connection slot, and the sixth connection slot is located on top of the fourth connection slot; later, removing the photoresist layer to reveal the under bump metallurgy layer which is not covered by the connection metal layer; at last, removing the under bump metallurgy layer which is not covered by the connection metal layer to enable the under bump metallurgy layer to merely cover the bond pad, the first polymer block and the second polymer block.

Therefore, when the bump structure is eutecticly bonded with one contact (such as connection pad or pin) of another electronic device, a bottom surface of the contact is coupled to the connection metal layer of the bump structure, and part of the contact is inserted into the groove and the connection slot. Via ramps of the grooves, the contact area between the bump structure and the contact may be increased to raise the coupling strength between the contact and the bump structure. Besides, when the contact is coupled to the connection metal layer, a displacement phenomenon of the contact can be avoided. In addition, the bump structure may utilize the first polymer block and the second polymer block as base materials for cost savings of electroplating. In this invention, the bump structure may apply in Chip-on-Glass (COG) package, when the bump is laminated onto a glass substrate, the groove may increase flows of anisotropic conductive film located between the bump and the glass substrate to prevent gathering of the conductive particles of the anisotropic conductive film between adjacent bumps to lead a short phenomenon. Or, for the reason that the polymer body and the grooves possess elasticity, the bump may directly laminate onto a bond pad of the glass substrate instead of using anisotropic conductive film therefore lowering the cost.

DETAILED DESCRIPTION OF THE INVENTION

Figure 1:
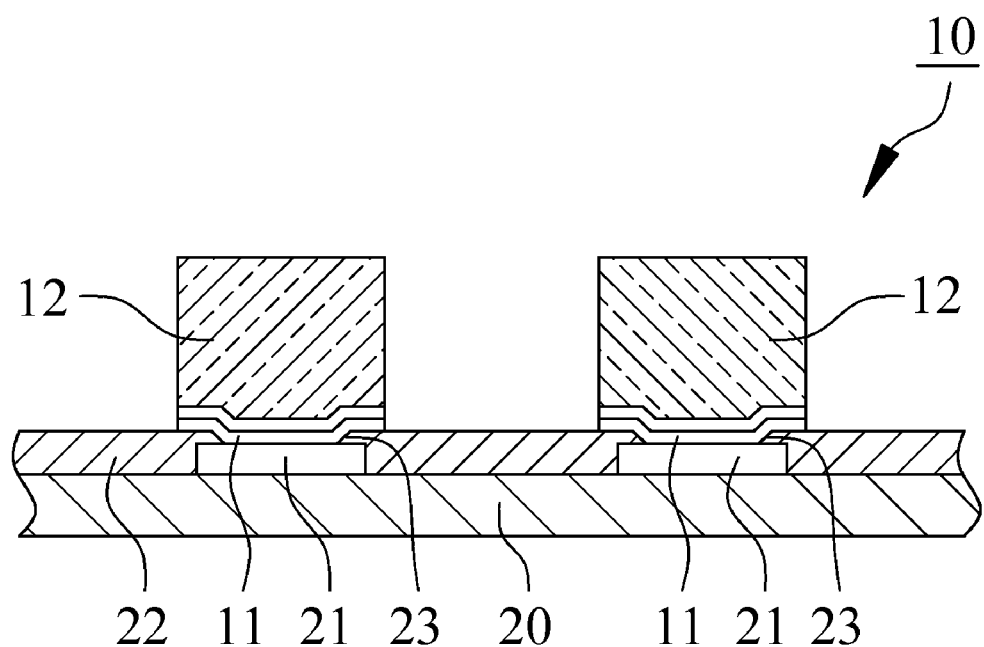
FIG. 1 is a cross-sectional schematic diagram illustrating a conventional bump structure.
Figure 2:
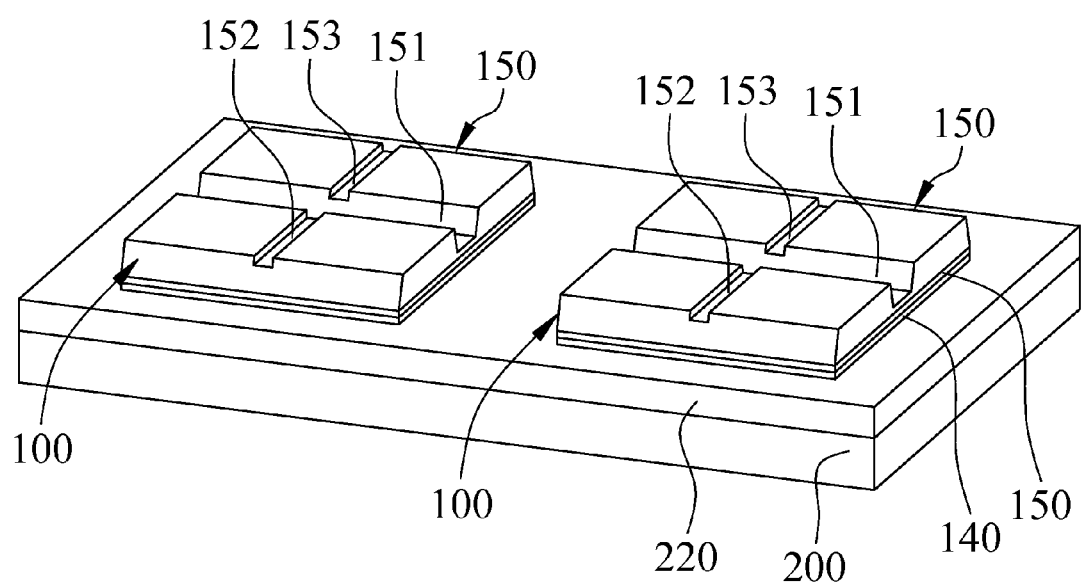
FIG. 2 is a three-dimensional view illustrating a bump structure in accordance with a preferred embodiment of the present invention.
Figure 3:
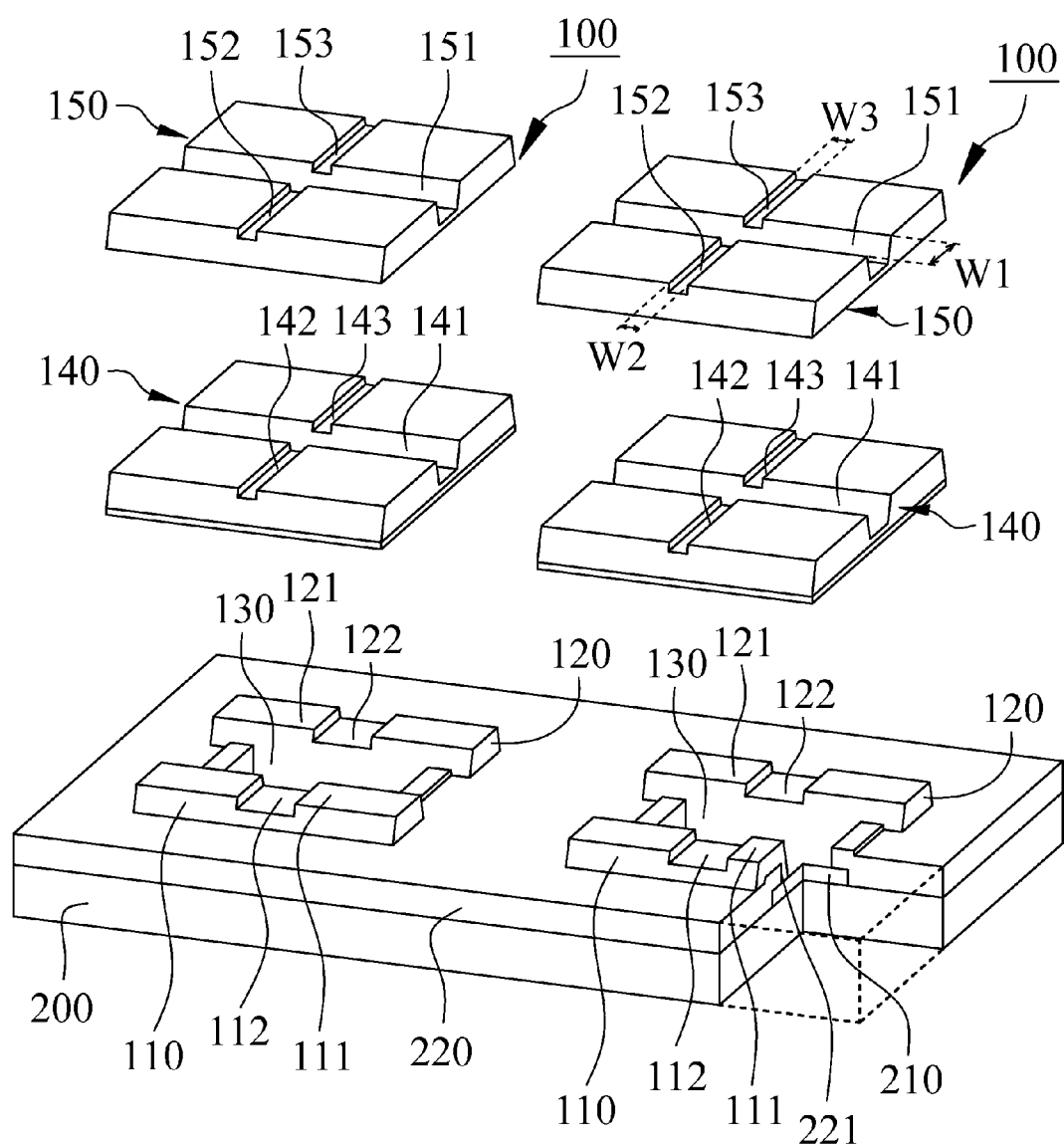
FIG. 3 is a three-dimensional exploded view illustrating the bump structure in accordance with a preferred embodiment of the present invention.

With reference to FIGS. 2 and 3, a bump structure 100 disposed on a substrate 200 having a plurality of bond pads 210 and a protecting layer 220 in accordance with a preferred embodiment of the present invention, wherein the protecting layer 220 comprises a plurality of openings 221, and the openings 221 reveal the bond pads 210. The bump structure 100 is electrically connected with each of the bond pads 210 and comprises a first polymer block 110, a second polymer block 120, a first groove 130, an under bump metallurgy layer 140 and a connection metal layer 150, wherein the first polymer block 110 and the second polymer block 120 are individual blocks separately and located at two sides of the first groove 130. The first groove 130 reveals the bond pad 210. With reference to FIGS. 3 and 5E, the first polymer block 110 and the second polymer block 120 are disposed on the bond pad 210 and the protecting layer 220, wherein the first polymer block 110 comprises a first top surface 111 and a first connection slot 112 recessed from the first top surface 111, and the second polymer block 120 comprises a second top surface 121 and a second connection slot 122 recessed from the second top surface 121. The first connection slot 112 of the first polymer block 110 and the second connection slot 122 of the second polymer block 120 are in communication with the first groove 130, the under bump metallurgy layer 140 covers the bond pad 210 and forms a second groove 141, a third connection slot 142 and a fourth connection slot 143, wherein the second groove 141 is in communication with the third connection slot 142 and the fourth connection slot 143. The material of the under bump metallurgy layer 140 is TiW/Au. The under bump metallurgy layer 140 is covered by the connection metal layer 150, wherein a third groove 151, a fifth connection slot 152 and a sixth connection slot 153 are formed on the connection metal layer 150, and the third groove 151 is in communication with the fifth connection slot 152 and the sixth connection slot 153. In this embodiment, the third groove 151, the fifth connection slot 152 and the sixth connection slot 153 are formed in a cross shape, wherein the second groove 141 of the under bump metallurgy layer 140 is located between the first groove 130 and the third groove 151, the third connection layer 142 of the under bump metallurgy layer 140 is located between the first connection slot 112 of the first polymer block 110 and the fifth connection slot 152 of the connection metal layer 150, and the fourth connection slot 143 of the under bump metallurgy layer 140 is located between the second connection slot 122 of the second polymer block 120 and the sixth connection slot 153 of the connection metal layer 150. The third groove 151 comprises a first width W1, the fifth connection slot 152 comprises a second width W2, the sixth connection slot 153 comprises a third width W3, the first width W1 is larger than the second width W2 and the third width W3.

Figure 4A:
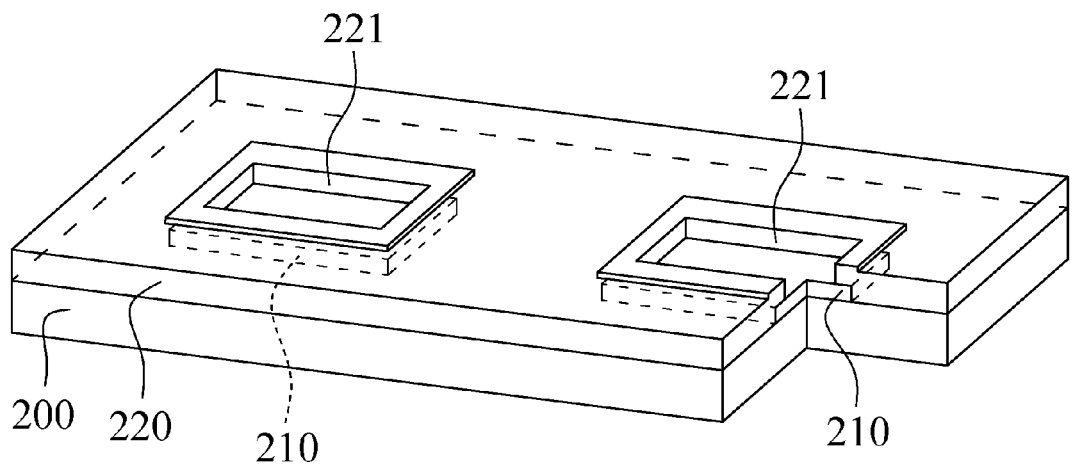
FIGS. 4A to 4L are three-dimensional views illustrating a process of manufacturing a bump structure with a preferred embodiment of the present invention.
Figure 4B:
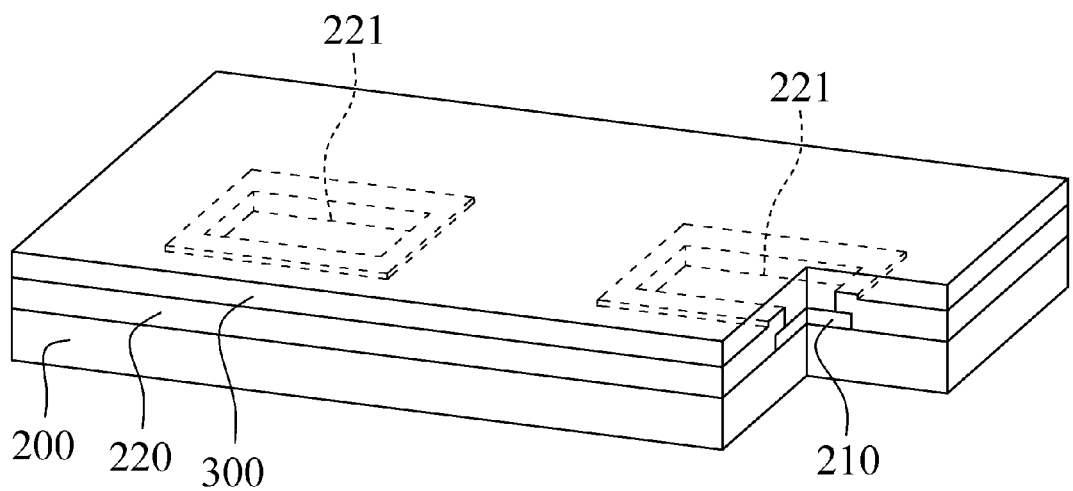
Figure 4C:
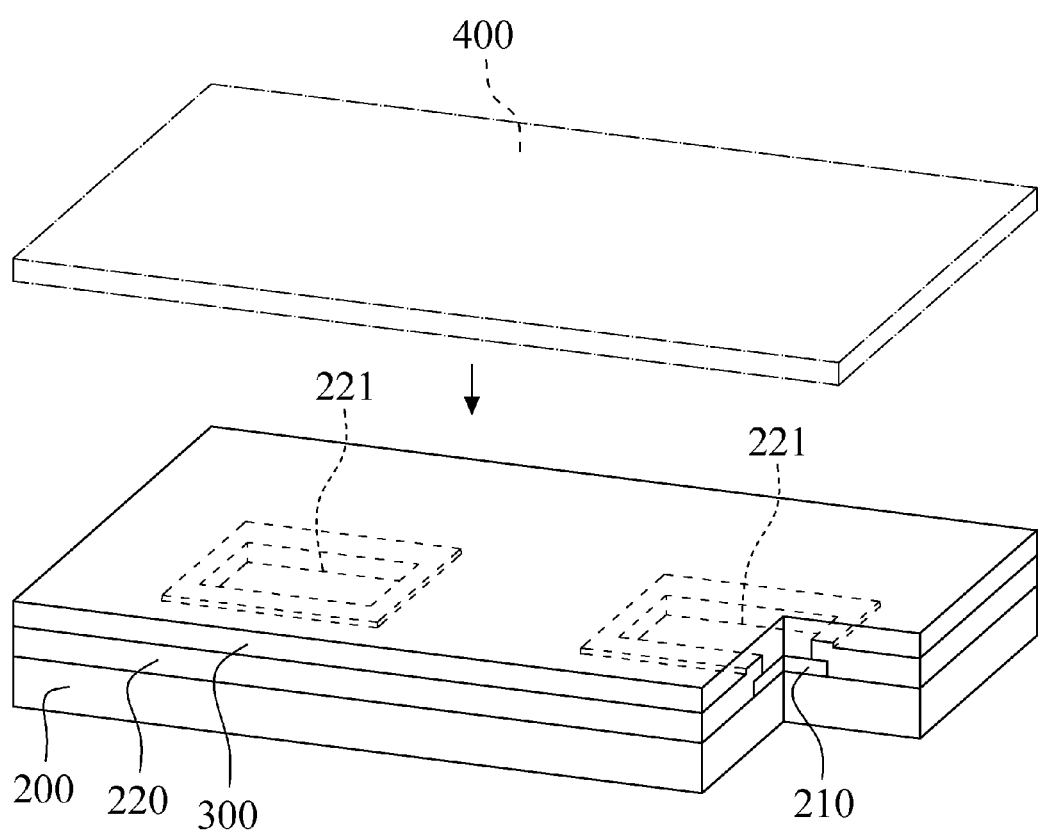
Figure 4D:
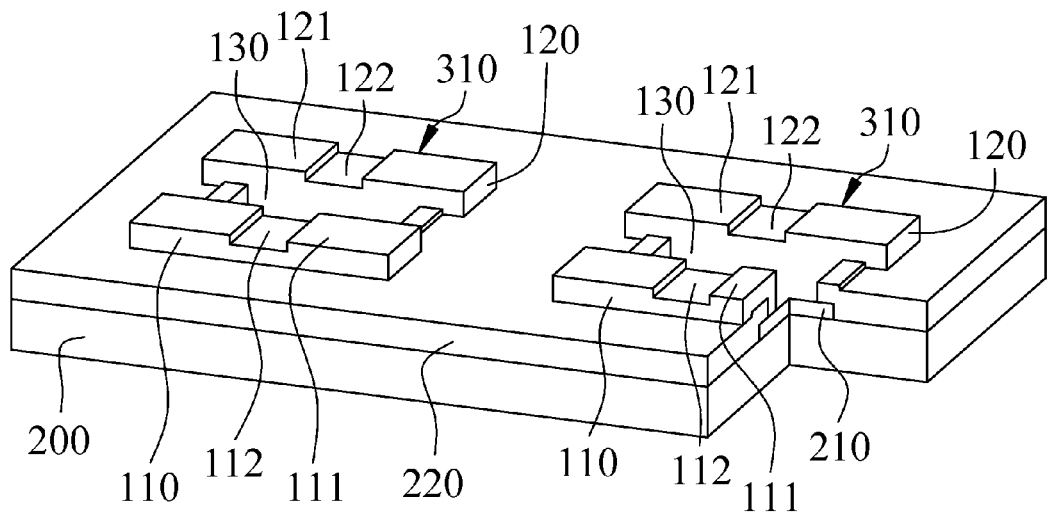
Figure 4E:
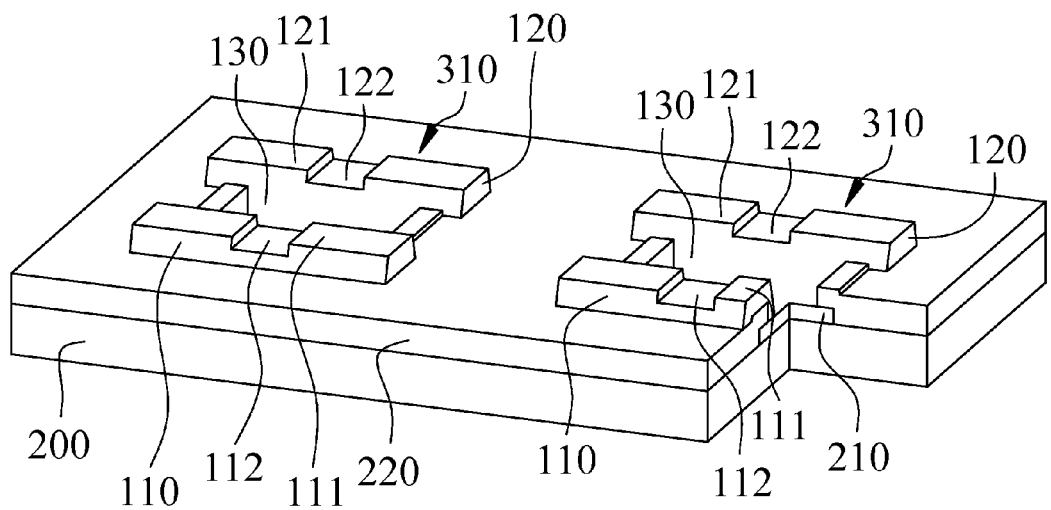
Figure 4F:
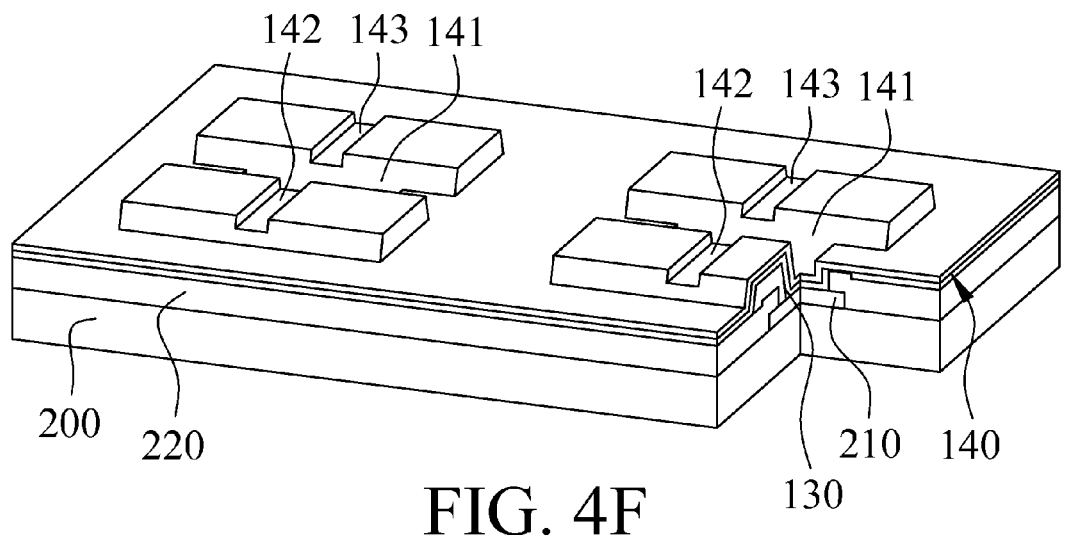
Figure 4G:
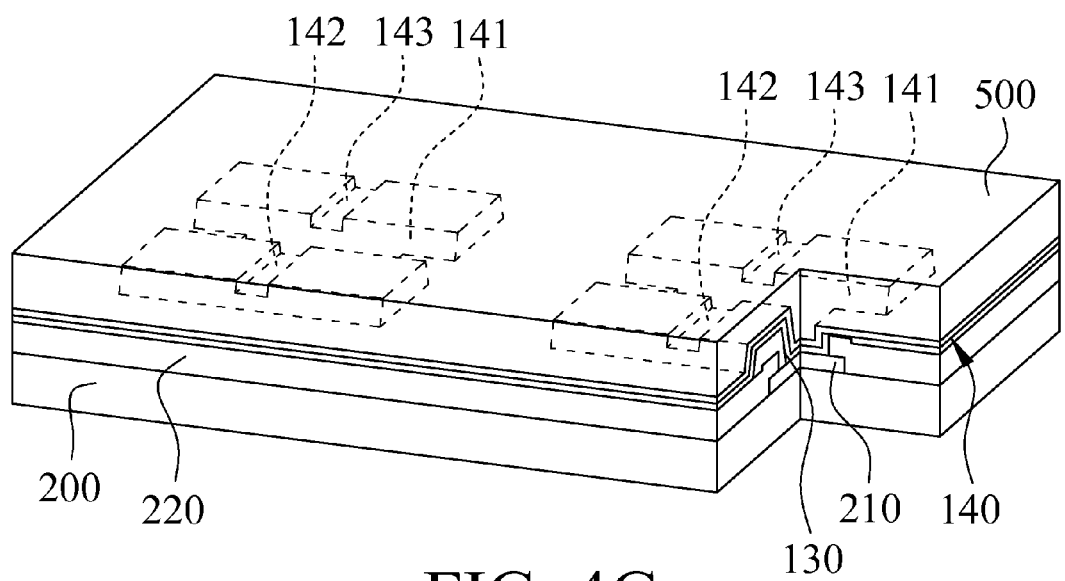
Figure 4H:
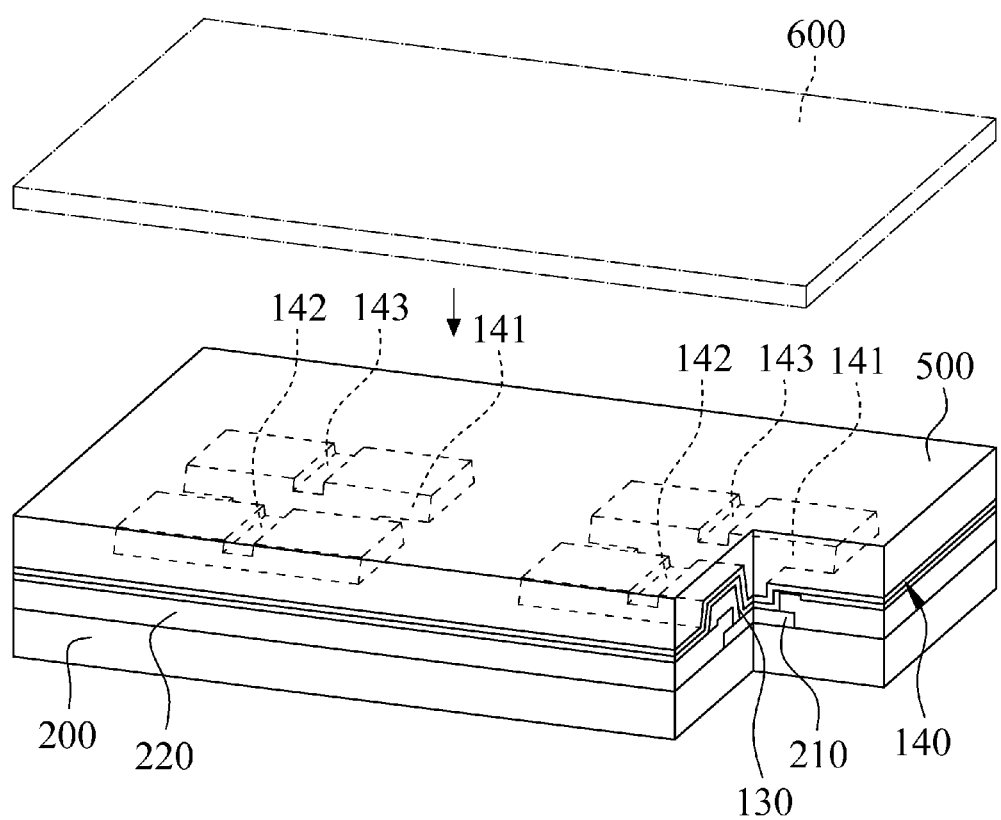
Figure 4I:
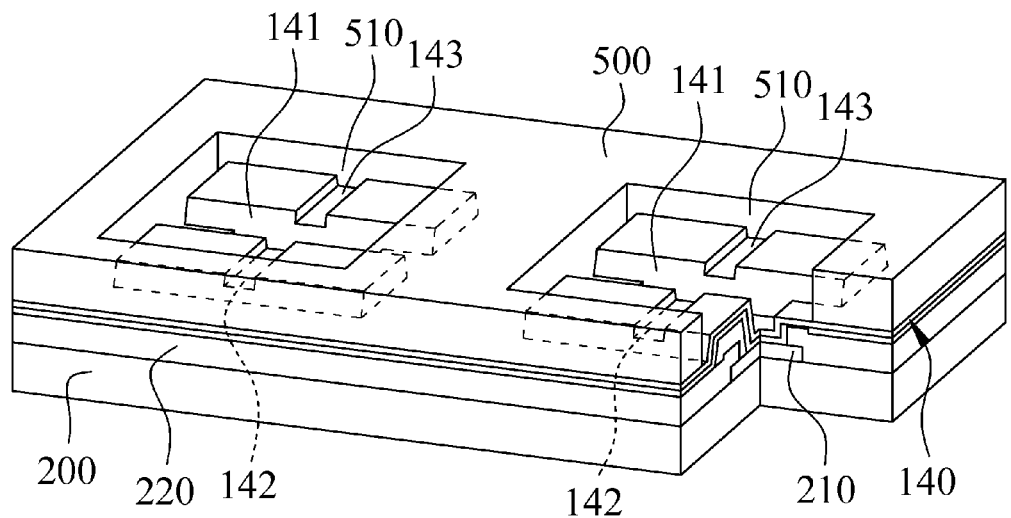
Figure 4J:
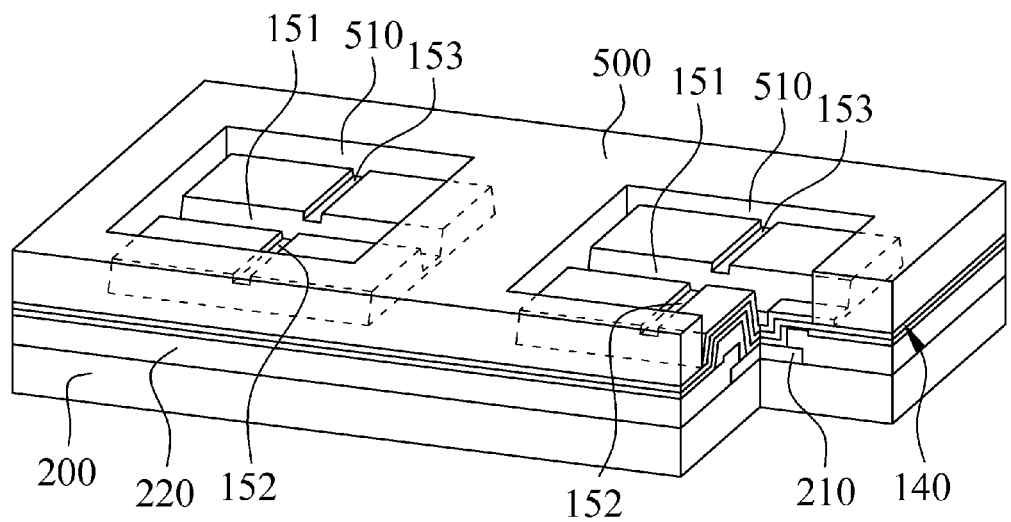
Figure 4K:
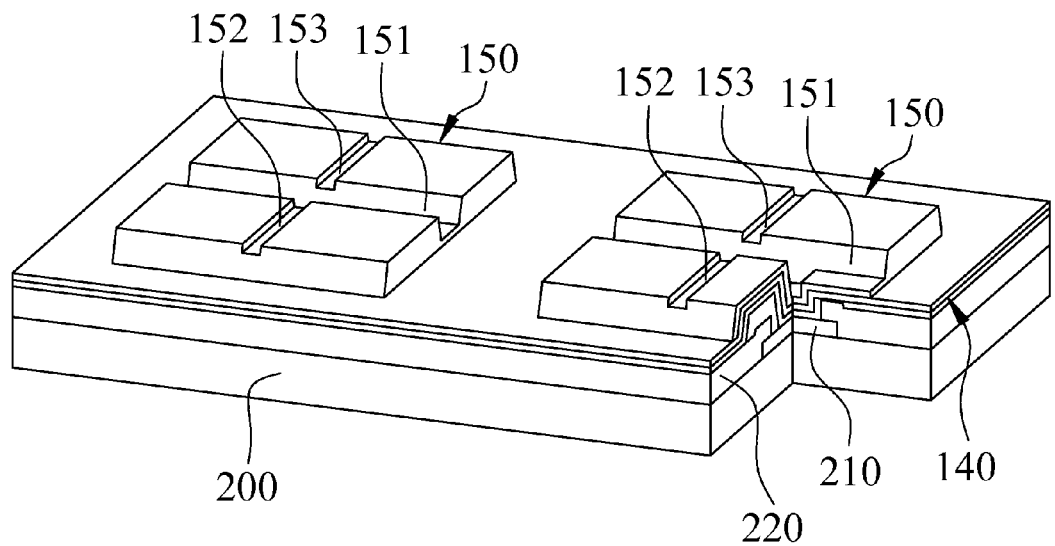
Figure 4L:
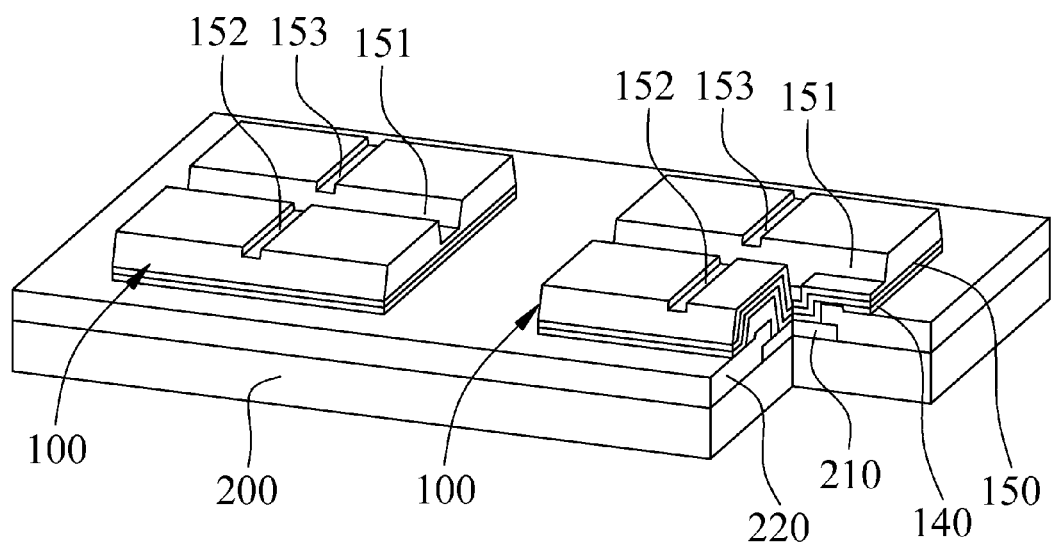
Figure 5A:
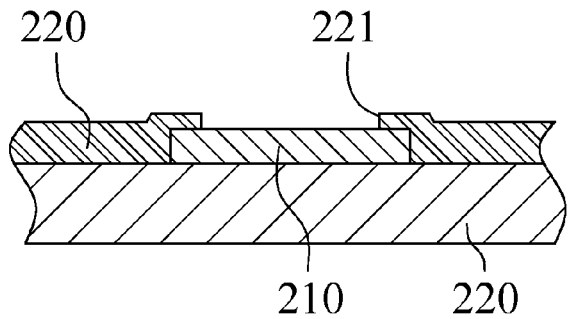
FIGS. 5A to 5L are cross-sectional schematic diagrams illustrating the process of manufacturing a bump structure in accordance with a preferred embodiment of the present invention.
Figure 5B:
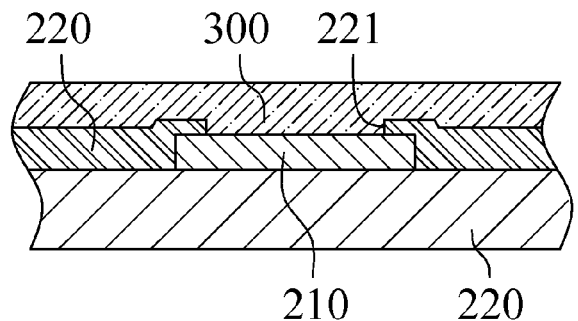
Figure 5C:
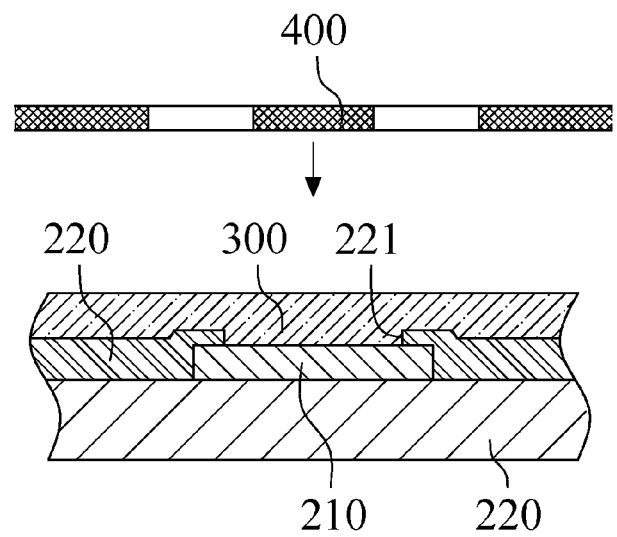
Figure 5D:
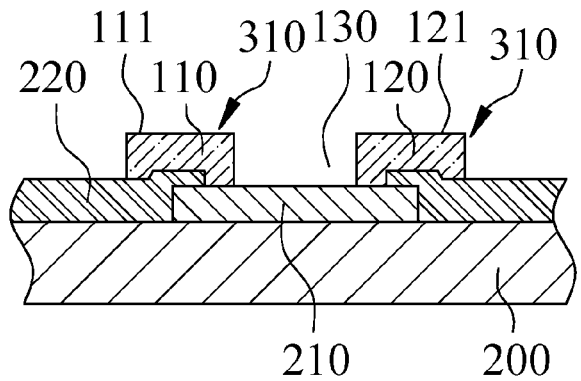
Figure 5E:
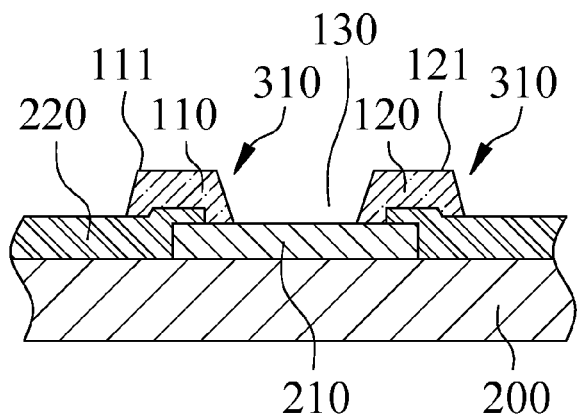
Figure 5F:
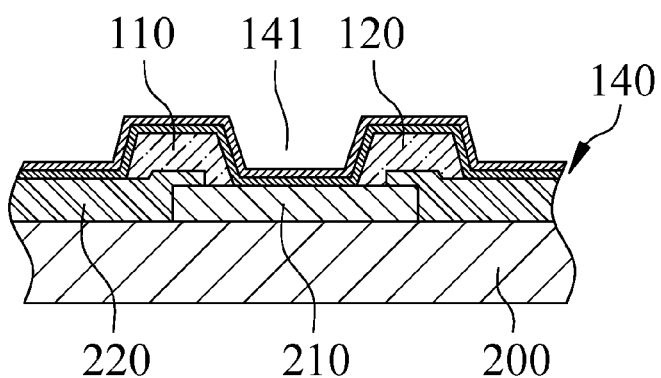
Figure 5G:
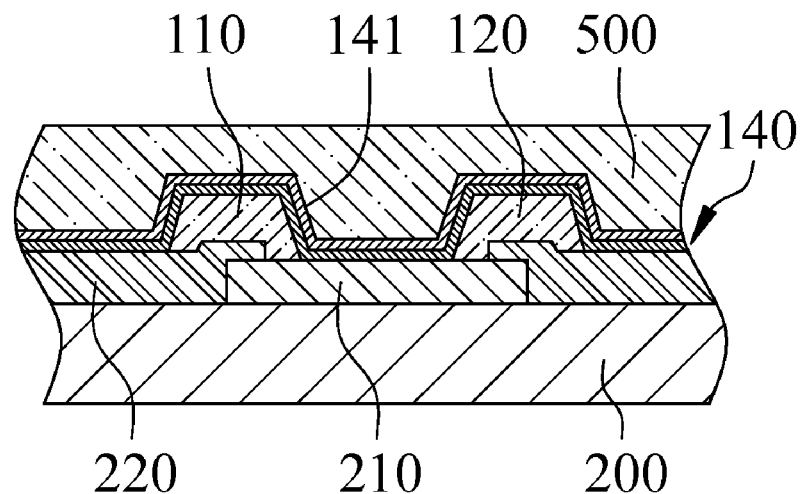
Figure 5H:
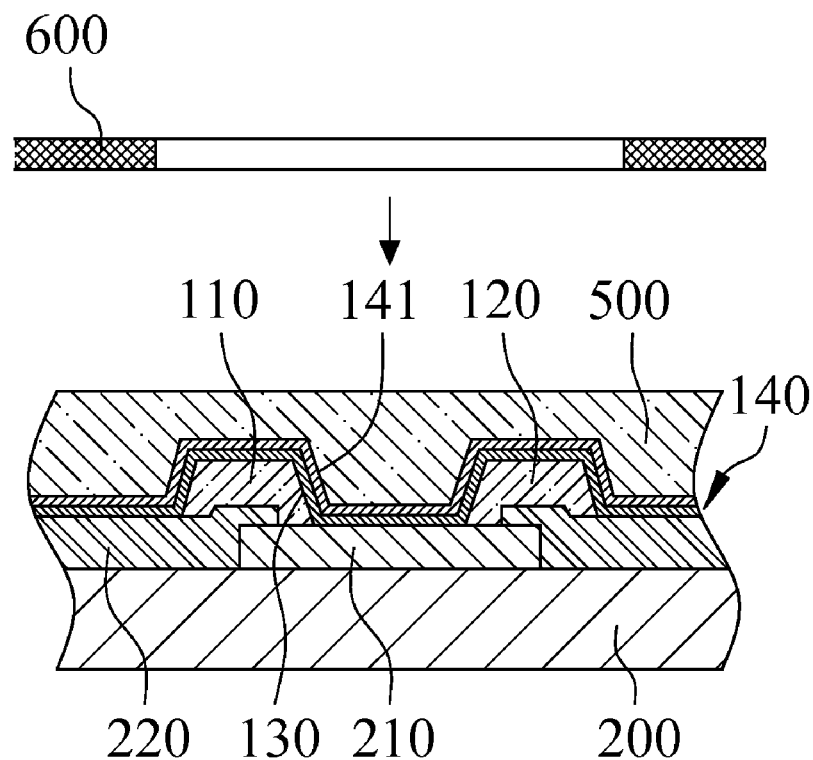
Figure 5I:
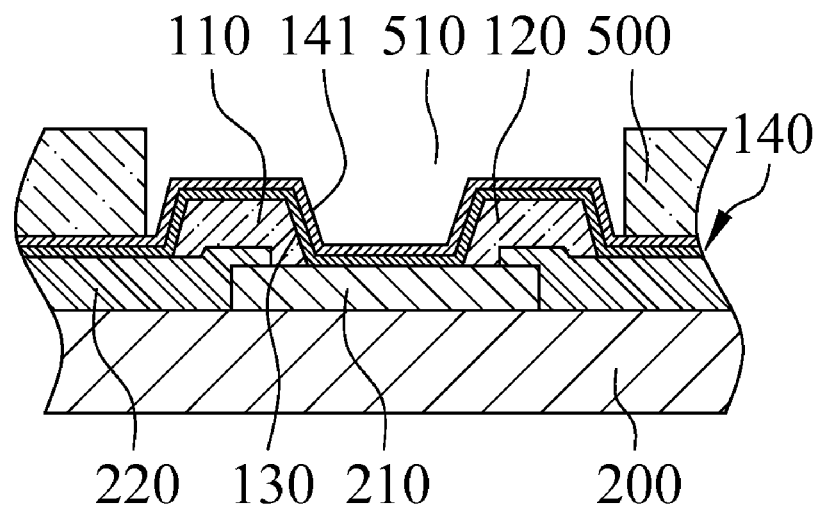
Figure 5J:
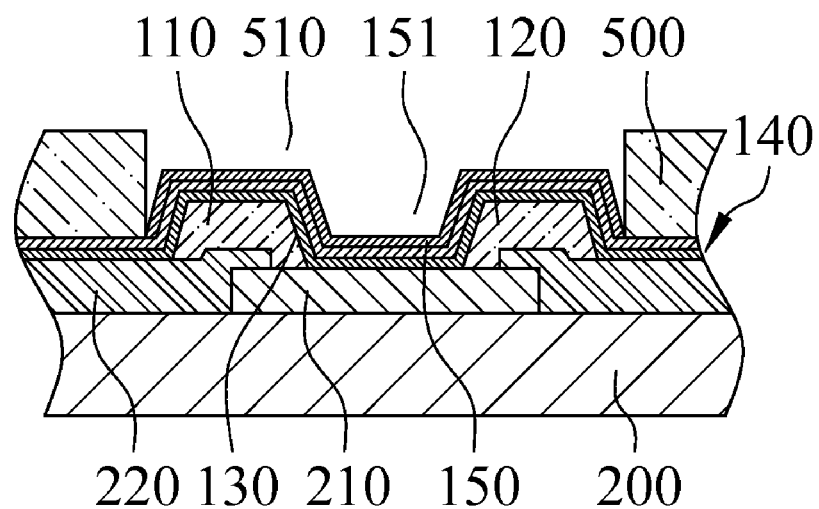
Figure 5K:
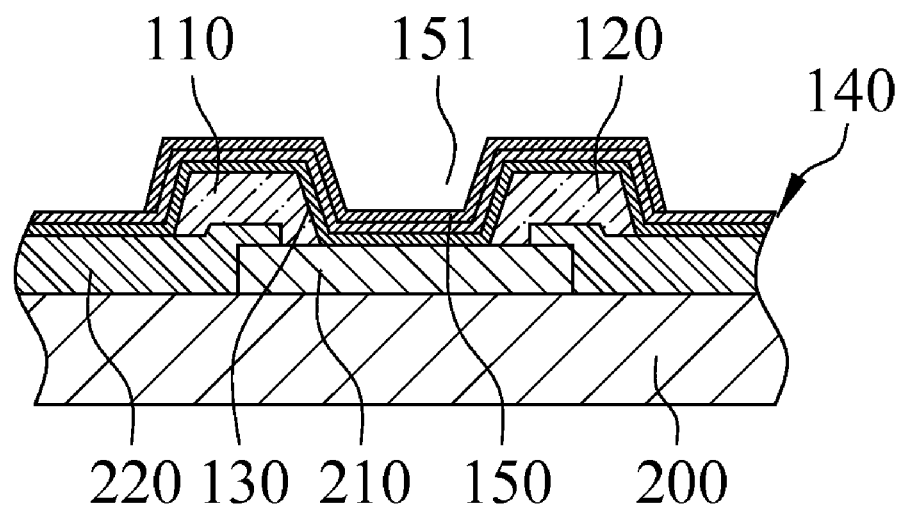
Figure 5L:
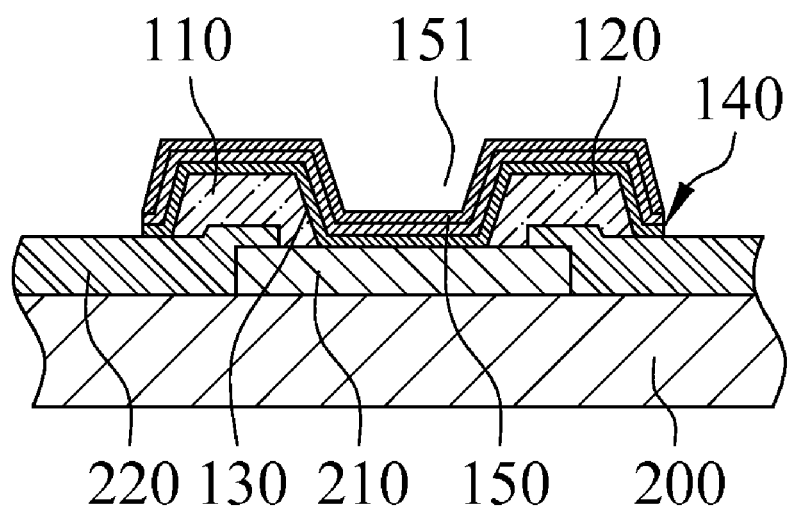

With reference to FIGS. 4A to 4M and 5A to 5M, represented a process of manufacturing the bump structure 100 comprises the steps as follow: first, referring to FIGS. 4A and 5A, providing a substrate 200 having a plurality of bond pads 210 and a protecting layer 220, wherein the protecting layer 220 comprises a plurality of openings 221, and the openings 221 reveal the bond pads 210; next, with reference to FIGS. 4B and 5B, forming a polymer layer 300 on the substrate 200, and the polymer layer 300 covers the protecting layer 220 and the bond pad 210; then, with reference to FIGS. 4C and 5C, providing a first mask and performing a first exposure; afterward, with reference to FIGS. 4D and 5D, removing the first mask 400 and performing a first development to enable the polymer layer 300 to form a plurality of polymer bumps 310, each of the polymer bumps 310 corresponds one bond pad 210 and comprises a first polymer block 110, a second polymer block 120 and a first groove 130, wherein the first polymer block 110 and the second polymer block 120 are individual blocks and located at two sides of the first groove 130, the first groove 130 reveals the bond pad 210, and the first polymer block 110 and the second polymer block 120 are disposed on the bond pad 210 and the protecting layer 220, referring to FIG. 4, the first polymer block 110 comprises a first top surface 111 and a first connection slot 112 recessed from the first top surface 111, the second polymer block 120 comprises a second top surface 121 and a second connection slot 122 recessed from the second top surface 121, wherein the first connection slot 112 of the first polymer block 110 and the second connection slot 122 of the second polymer block 120 are in communication with the first groove 130; later, with reference to FIGS. 4E and 5E, curing the polymer bumps 310; next, with reference to FIGS. 4F and 5F, forming an under bump metallurgy layer 140 on the substrate 200, the under bump metallurgy layer 140 covers the bond pad 210, the protecting layer 220, the first polymer block 110 and the second polymer block 120, with reference to FIGS. 4D and 4F, a second groove 141, a third connection slot 142 and a fourth connection slot 143 are formed on the under bump metallurgy layer 140, wherein the second groove 141 is in communication with the third connection slot 142 and the fourth connection slot 143 and located on top of the first groove 130, the third connection slot 142 is located on top of the first connection slot 112, and the fourth connection slot 143 is located on top of the second connection slot 122; afterward, with reference to FIGS. 4G and 5G, forming a photoresist layer 500 on the under bump metallurgy layer 140; later, with reference to FIGS. 4H and 5H, providing a second mask 600 and performing a second development to enable the photoresist layer 500 to form a plurality of openings 510, each of the openings 510 corresponds each of the polymer bumps 310 and reveals the under bump metallurgy layer 140 located within each of the openings 510; then, with reference to FIGS. 4J and 5J, forming a connection metal layer 150 located within the openings 510, the connection metal layer 150 covers the under bump metallurgy layer 140 revealed by the openings 510, wherein a third groove 151, a fifth connection slot 152 and a sixth connection slot 153 are formed on the connection metal layer 150, and the third groove 151 is in communication with the fifth connection slot 152 and the sixth connection slot 153, referring to FIG. 3, the third groove 151 is located on top of the second groove 141, the fifth connection slot 152 is located on top of the third connection slot 142, and the sixth connection slot 153 is located on top of the fourth connection slot 143; next, with reference to FIGS. 4K and 5K, removing the photoresist layer 500 to reveal the under bump metallurgy layer 140 which is not covered by the connection metal layer 150; at last, with reference to FIGS. 3, 4L and 5L, removing the under bump metallurgy layer 140 which is not covered by the connection metal layer 150 to enable the under bump metallurgy layer 140 to merely cover the first polymer block 110 and the second polymer block 120.

Figure 6:
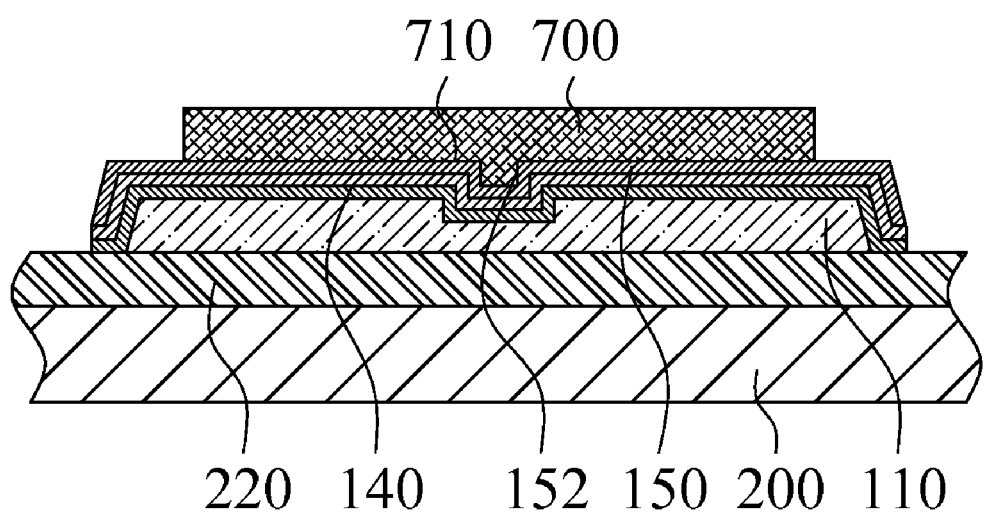
FIG. 6 is a lateral view illustrating a contact being connected with the bump structure in accordance with a preferred embodiment of the present invention.

Referring to FIG. 6, when the bump structure 100 is eutecticly bonded with one contact 700 (such as connection pad or pin) of another electronic device, a bottom surface 710 of the contact 700 is coupled to the connection metal layer 150 of the bump structure 100, and part of the contact 700 is inserted into the third groove 151, the fifth connection slot 152 and the sixth connection slot 153. Via ramps of the third groove 151, the contact area between the bump structure 100 and the contact 700 can be increased to raise the coupling strength between the contact 700 and the bump structure 100. Besides, for the reason that part of the contact 700 is inserted into the connection metal layer 150, the fifth connection slot 152 and the sixth connection slot 153, a displacement phenomenon likely occurred at the contact 700 can be avoided. In addition, the bump structure 100 may utilize the first polymer block 110 and the second polymer block 120 as base materials therefore saving costs for electroplating.

While this invention has been particularly illustrated and described in detail with respect to the preferred embodiments thereof, it will be clearly understood by those skilled in the art that it is not limited to the specific features and descriptions and various modifications and changes in form and details may be made without departing from the spirit and scope of this invention.

What is claimed is:

1. A bump structure disposed on a substrate, the substrate having a plurality of bond pads and a protecting layer, wherein
   the protecting layer having a plurality of openings that reveal the bond pads, the bump structure electrically connected with each of the bond pads comprising:
   a first polymer block disposed on the bond pad and the protecting layer and comprising a first top surface and a first connection slot recessed from the first top surface, wherein the first polymer block is an individual block;
   a second polymer block disposed on the bond pad and the protecting layer and comprising a second top surface and a second connection slot recessed from the second top surface, wherein the second polymer block is an individual block;
   a first groove located between the first polymer block and the second polymer block and revealing the bond pad, wherein the first groove is in communication with the first connection slot of the first polymer block and the second connection slot of the second polymer block; an under bump metallurgy layer covering the bond pad, the first polymer block and the second polymer block to form a second groove, a third connection slot and a fourth connection slot; and
   a connection metal layer covering the under bump metallurgy layer to form a third groove, a fifth connection slot and a sixth connection slot, wherein the third groove is in communication with the fifth connection slot and the sixth connection slot, the second groove of the under bump metallurgy layer is located between the first groove and the third groove, the third connection slot of the under bump metallurgy layer is located between the first connection slot and the fifth connection slot, and the fourth connection slot of the under bump metallurgy layer is located between the second connection slot and the sixth connection slot.

2. The bump structure in accordance with claim 1, wherein the third groove, the fifth connection slot and the sixth connection slot are formed in a cross shape.

3. The bump structure in accordance with claim 2, wherein the third groove comprises a first width, the fifth connection slot comprises a second width, and the first width is larger than the second width.

4. The bump structure in accordance with claim 3, wherein the sixth connection slot comprises a third width, the first width is larger than the third width.

5. A process of manufacturing a bump structure comprises the steps of:
   providing a substrate having a plurality of bond pads and a protecting layer, the protecting layer comprising a plurality of openings, and the openings reveal the bond pads; forming a polymer layer on the substrate, the polymer layer covering the protecting layer and the bond pads;
   providing a first mask and performing a first exposure;
   removing the first mask and performing a first development to enable the polymer layer to form a plurality of polymer bumps, each of the polymer bumps corresponding to one bond pad, wherein each of the polymer bumps comprising:
   a first polymer block disposed on the bond pad and the protecting layer and comprising a first top surface and a first connection slot recessed from the first top surface, wherein the first polymer block is an individual block;
   a second polymer block disposed on the bond pad and the protecting layer and comprising a second top surface and a second connection slot recessed from the second top surface, wherein the second polymer block is an individual block; and
   a first groove located between the first polymer block and the second polymer block and revealing the bond pad, wherein the first groove is in communication with the first connection slot of the first polymer block and the second connection slot of the second polymer block, curing the polymer bumps;
   forming an under bump metallurgy layer on the substrate, the under bump metallurgy layer covering the protecting layer, the bond pad, the first polymer block and the second polymer block, wherein a second groove, a third connection slot and a fourth connection slot are formed on the under bump metallurgy layer, the second groove is in communication with the third connection slot and the fourth connection slot and located on top of the first groove, the third connection slot is located on top the first connection slot, and the fourth connection slot is located on top of the second connection slot;

forming a photoresist layer on the under bump metallurgy layer;

providing a second mask and performing a second exposure;

removing the second mask and performing a second development to enable the photoresist layer to form a plurality of openings, each of the openings corresponding to each of the polymer bumps, and each of the openings reveals the under bump metallurgy layer located within each of the openings;

forming a connection metal layer within the openings, the connection metal layer covering the under bump metallurgy layer revealed by the openings, wherein a third groove, a fifth connection slot and a sixth connection slot are formed on the connection metal layer, the third groove is in communication with the fifth connection slot and the sixth connection slot and located on top of the second groove, the fifth connection slot is located on top of the third connection slot, and the sixth connection slot is located on top of the fourth connection slot; removing the photoresist layer to reveal the under bump metallurgy layer which is not covered by the connection metal layer; and removing the under bump metallurgy layer which is not covered by the connection metal layer to enable the under bump metallurgy layer to merely cover the bond pad, the first polymer block and the second polymer block.

6. The process of manufacturing a bump structure in accordance with claim 5, wherein in the step of forming a connection metal layer within the openings, the third groove, the fifth connection slot and the sixth connection slot are formed in a cross shape.

7. The process of manufacturing a bump structure in accordance with claim 5, wherein in the step of forming a connection metal layer within the openings, the third groove comprises a first width, the fifth connection slot comprises a second width, and the first width is larger than the second width.

8. The process of manufacturing a bump structure in accordance with claim 7, wherein in the step of forming a connection metal layer within the openings, the sixth connection slot comprises a third width, the first width is larger than the third width.

* * * * *